(12) United States Patent
Isobe

(10) Patent No.: US 6,483,684 B2
(45) Date of Patent: Nov. 19, 2002

(54) CURRENT LIMITING APPARATUS

(75) Inventor: Yoshihiro Isobe, Kanagawa (JP)

(73) Assignee: Ando Electric Co., Ltd., Kanagawa (JP)

( * ) Notice: Subject to any disclaimer, the term of this patent is extended or adjusted under 35 U.S.C. 154(b) by 144 days.

(21) Appl. No.: 09/725,985

(22) Filed: Nov. 29, 2000

(65) Prior Publication Data

US 2001/0002111 A1 May 31, 2001

(30) Foreign Application Priority Data

Nov. 30, 1999 (JP) ........................................... 11-341263

(51) Int. Cl.[7] .............................. H02H 9/02; H02H 7/10
(52) U.S. Cl. ...................... 361/93.9; 361/93.2; 361/18; 327/540; 323/274
(58) Field of Search ................................ 361/93.9, 93.7, 361/93.2, 78, 86, 18; 327/538, 540; 323/312, 274

(56) References Cited

U.S. PATENT DOCUMENTS

| | | | | |
|---|---|---|---|---|
| 4,633,162 A | * | 12/1986 | Melbert | 361/18 |
| 4,937,697 A | * | 6/1990 | Edwards et al. | 361/18 |
| 5,589,759 A | * | 12/1996 | Borgato et al. | 323/222 |
| 5,666,044 A | * | 9/1997 | Tuozzolo | 323/273 |
| 6,411,488 B1 | * | 6/2002 | Nishiwaki | 361/154 |

* cited by examiner

Primary Examiner—Kim Huynh
(74) Attorney, Agent, or Firm—Fish & Richardson P.C.

(57) ABSTRACT

In the current limiting circuit, which is provided with: the D/A converter 2A to output the voltage signal to supply the power source onto the load 11; reversal amplifier circuit to amplify the voltage signal; capacitor 10 to absorb the fluctuation of the power source supplied onto the load 11; operational amplifier 4B to set the amplification factor of the reversal amplifier circuit; transistor 5; and resistor 3E, the current detection circuit 7 detects the current value to be inputted into the load 11, and according to the detected current value, calculates the voltage at the current detection position, and the CPU 1 sets the predetermined voltage, the comparing circuit 8 compares the setting voltage value to the calculated voltage value, and according to the comparison result, by ON/OFF-controlling the switch 9, the setting of the amplification factor of the reversal amplifier is changed.

5 Claims, 6 Drawing Sheets

CURRENT LIMITING APPARATUS

BACKGROUND OF THE INVENTION

The present invention relates to a current limiting apparatus, and in detail, to a current limiting apparatus for used in a single body power source apparatus and an integrated circuit measuring apparatus.

Referring to FIG. 5 to FIG. 8, the conventional current limiting apparatus will be described. FIG. 5 is a view showing the circuit structure of a conventional current limiting apparatus 200. In FIG. 5, the conventional current limiting apparatus is structured by a CPU 1, D/A converters 2A, and 2B, resistors 3A, 3B, and 3D, operational amplifiers 4A and 4B, transistor 5, and capacitor 10. In this conventional current limiting apparatus 200, its one end is connected to a load 11 structured by a DUT (Device Under Test).

Initially, the structure of this conventional current limiting circuit 200 will be described below. The CPU 1 is connected to the D/A converter 2A and D/A converter 2B, and an output terminal of the D/A converter 2A is connected to a reversal input terminal of the operational amplifier 4A through the resistor 3A. Further, non-reversal input terminal of the operational amplifier 4A is electrically grounded. The output terminal of the operational amplifier 4A is connected to one end of the capacitor 10 and the load 11. Further, the other end of the capacitor 10 is electrically grounded. One end of the capacitor 10 and the load 11 are connected to the reversal input terminal of the operational amplifier 4A through a feedback resistor 3B. Thereby, a negative feedback closed loop is formed between the output terminal and the reversal input terminal of the operational amplifier 4A.

Further, the operational amplifier 4A has a current limiting adjustment terminal A, and the current limiting adjustment terminal A is connected to the collector terminal of the transistor 5. The output terminal of the operational amplifier 4B is connected to the base terminal of the transistor 5, and the output terminal of the D/A converter 2B is connected to the non-reversal input terminal of the operational amplifier 4B. The emitter terminal of the transistor 5 is connected to a negative source terminal B through the resistor 3D. Further, the emitter terminal of the transistor 5 is connected to the reversal input terminal of the operational amplifier 4B. Thereby, the negative feedback closed loop is formed between the output terminal of the operational amplifier 4B and the reversal input terminal of the operational amplifier 4B through the emitter terminal of the transistor 5.

Next, the operation of the conventional current limiting apparatus 200 in FIG. 5 will be described. The function of this conventional current limiting apparatus 200 can be divided into 2 kinds of functions, that is, the current limiting function to limit the output current IO of the operational amplifier 4A by the CPU 1, and the function in which the input voltage VIN is set by the CPU 1, and the current IO required by the load 11 is supplied from the operational amplifier 4A.

Initially, the function to limit the output current IO will be described. The CPU 1 sets the voltage to limit the output current IO of the operational amplifier 4A by the digital signal, and outputs to the D/A converter 2B. The D/A converter 2B converts the inputted digital signal into analog signal, and outputs to the non-reversal input terminal of the operational amplifier 4B. When this analog signal is inputted, the operational amplifier 4B generates the potential difference between the base and emitter of the transistor 5, and the current flows from the base to the emitter. Thereby, the transistor 5 is operated, and the limiting current IA flowing through the current limiting adjustment terminal A of the operational amplifier 4A is determined according to the relationship of the negative source terminal B, emitter voltage, and resistor 3D.

When the resistance value of the resistor 3D is RD, and the voltage value of the negative source terminal B is VB, then, the emitter voltage of the transistor 5 is set by the digital signal outputted from the CPU 1, and is equal to the voltage value VC converted into the analog value by the D/A converter 2B, therefore, the limiting current IA flowing in the current limiting adjustment terminal A is $$IA=(VC-VB)/RD \quad (1).$$

As described above, by limiting the current flowing in the current limiting adjustment terminal A of the operational amplifier 4A, the output current IO of the operational amplifier 4A is limited so that the input current into the load 11 is not excessive. Further, the following relationship exists between the output current IO of the operational amplifier 4A and the limiting current IA flowing in the current limiting adjustment terminal A:

$$IO=IA \cdot G \quad (2).$$

Herein, G is a current amplification factor of the operational amplifier 4A. By using the above expressions (1) and (2), the following relational expression is obtained between the current limit voltage VC set by the CPU 1 and the output current IO:

$$IO=G \cdot (VC-VB)/RD \quad (3).$$

In this expression (3), as shown in FIG. 6, the output current IO has a proportional relationship to the current limit voltage VC set by the CPU 1.

Next, the function to supply the current to the load 11 in the setting of the input voltage will be described. In the conventional current limiting apparatus 200, the CPU 1 sets the digital signal corresponding to the input setting voltage and outputs to the D/A converter 2A, and the D/A converter 2A converts the inputted digital signal into the analog signal and outputs to the resistor 3A. This analog signal is inputted into the reversal input terminal of the operational amplifier 4A through the resistor 3A, and this operational amplifier 4A amplifies the output voltage to the input setting voltage corresponding to this inputted analog signal. The voltage amplified by the operational amplifier 4A is outputted to the load 11, and the operational amplifier 4A outputs the current IO to be supplied to the load 11. In this case, the capacitor 10 is charged when the output current flows.

Herein, when the value of the voltage inputted into the reversal input terminal of the operational amplifier 4A by the digital signal outputted by the CPU 1, is VIN, the resistance value of the resistor 3A is R1, and the resistance value of the feedback resistor 3B is R2, then, the value VO of the voltage supplied to the load 11 is as follows:

$$VO=-(R2/R1) \cdot VIN \quad (4).$$

By this expression (4), the output voltage VO is determined by the input setting voltage VIN. When the capacity of the capacitor 10 is C, the value of the output current is IO, and the value of the output voltage is VO, then, the time t necessary for charging the capacitor is, $$t=(C \cdot VO)/IO \quad (5),$$

and when the expression (4) is substituted into the expression (5), it can be clear that the time t necessary for charging the capacitor is, as shown by the following expression, formed of the relationship of the input voltage VIN and output current IO:

$$t=-C\cdot(R2/R1)\cdot(VIN/IO) \qquad (6)$$

As described above, when the input voltage VIN is set by the CPU 1, because C, R1, and R2 are respectively known capacity of the capacitor 10, resistance values of the resistors 3A and 3B, the time t necessary for charging the capacitor 10 depends on only the output current IO.

FIG. 7 is a view showing the relationship of t –IO in the expression (6). As can be clearly seen from FIG. 7, the output current IO and the time t are in inversely proportional relationship to each other. In the case where the charging current for charging the capacitor 10 is IC, when the output current IO is smaller than the charging current IC, because a long period of time is necessary for charging the capacitor 10, the time t for supplying the current to the load 11 is increased.

However, in the conventional current limiting apparatus 200, by outputting the digital signal from the CPU 1 to the operational amplifier 4B through the D/A converter 2B, when the limiting current IA of the operational amplifier 4A is set, the output current IO of the operational amplifier 4A is limited by the limiting current IA, and when the current is supplied to the load 11, the current is limited lower than the current drive capacity. That is, when the current required by the load 11 is supplied, as the limiting current IA flowing from the current limiting adjustment terminal A set by the CPU 1 is closer to the limited output current IO, the current drive capacity is close to the limit, and there is a problem that a long period of time is necessary for reaching the current required by the load 11.

As the result, when the input voltage VIN is applied, because the current satisfying the load 11 is limited by the limiting current IA, the output voltage VO becomes a function proportional to the t1 in FIG. 8. Further, when the capacitor 10 is added to absorb the fluctuation of the voltage supplied to the load 11, because the time to charge the capacitor 10 is necessary, for the current to charge the capacitor 10, due to the limiting current IA, the output voltage has the relationship of the integral function proportional to the time t2 shown in FIG. 8, and there is also a problem that the time for supplying the current to the load 11 is further increased.

Furthermore, even when the maximum current of the operational amplifier 4A is sufficiently larger than the output current IO limited by the CPU 1, and the current drive capacity of the operational amplifier 4A is sufficient, the output current IO is limited by the limiting current IA set by the CPU 1.

A problem of the present invention is to provide a current limiting apparatus by which the setting voltage can be supplied onto the load more quickly, without the output current being limited by the limiting current of the operational amplifier.

SUMMARY OF THE INVENTION

In order to solve the problems, in the invention according to the first aspect, a current limiting apparatus, in which a power source signal output means (for example, a D/A converter 2A in FIG. 1) for outputting a voltage signal to supply a power source to a sample to be measured (for example, a load 11 in FIG. 1), a signal amplifying means (for example, a reversal amplifier circuit structured by resistors 3A and 3B and an operational amplifier 4A in FIG. 1) for amplifying the voltage signal outputted by the power source signal output means, a power source fluctuation absorption means (for example, a capacitor 10 in FIG. 1) for absorbing the fluctuation of the power source supplied to the sample to be measured by the voltage signal amplified by the signal amplifying means, and an amplification factor setting means (for example, a D/A converter 2B, operational amplifier 4B, transistor 5, and resistor 3D in FIG. 1) for setting a amplification factor in the signal amplifying means, are provided, the current limiting apparatus is characterized in that, it has: a current detection means (for example, a current detection circuit 7 to detect the current flowing through a resistor 3C in FIG. 1) for detecting a current value to be inputted into the sample to be measured; a voltage calculation means (for example, a current detection circuit 7 to calculate a voltage value according to a value of the current flowing through the resistor 3C in FIG. 1) for calculating the voltage at the current detection position, according to the current value detected by the current detection means; a voltage setting means (for example, the setting voltage stored in a CPU 1 in FIG. 1) for setting the predetermined voltage; a voltage comparing means (for example, a comparing circuit 8 in FIG. 1) for comparing the voltage value set by the voltage setting means to the voltage value calculated by the voltage calculation means; and an amplification factor changing means (for example, resistors 3E and 3F, a diode 6, and switch 9 in FIG. 1) for changing the setting of the amplification factor of the amplification factor setting means, according to the comparison result of the voltage comparing means.

According to the invention of the first aspect, in a current limiting apparatus, in which a power source signal output means for outputting a voltage signal to supply a power source to a sample to be measured, a signal amplifying means for amplifying the voltage signal outputted by the power source signal output means, a power source fluctuation absorption means for absorbing the fluctuation of the power source supplied to the sample to be measured by the voltage signal amplified by the signal amplifying means, and an amplification factor setting means for setting a amplification factor in the signal amplifying means, are provided, a current detection means detects a current value to be inputted into the sample to be measured; a voltage calculation means calculates the voltage at the current detection position, according to the current value detected by the current detection means; a voltage setting means sets the predetermined voltage; a voltage comparing means compares the voltage value set by the voltage setting means to the voltage value calculated by the voltage calculation means; and an amplification factor changing means changes the setting of the amplification factor of the amplification factor setting means, according to the comparison result of the voltage comparing means.

Further, like as the invention according to the second aspect, in the current limiting apparatus of the first aspect, the amplification factor changing means may be structured such that, when the voltage comparing means detects that the voltage value calculated by the voltage calculation means is larger than the predetermined voltage value set by the voltage setting means, the setting of the amplification factor of the amplification factor setting means is made smaller.

Further, like as the invention according to the third aspect, in the current limiting apparatus of the first or the second aspect, the amplification factor changing means may be structured such that it includes a diode (for example, a diode 6 in FIG. 1) and a switch (for example, a switch 9 in FIG. 1), and by ON/OFF-controlling the switch, the setting of the amplification factor of the amplification factor setting means is changed.

Accordingly, according to the invention of the first aspect to the third aspect, the power source voltage can be quickly applied onto the sample to be measured, and in the overall test, the test time of the sample to be measured can be reduced.

DETAILED DESCRIPTION OF THE PREFERRED EMBODIMENTS

Referring to FIG. 1 to FIG. 4, an embodiment of the current limiting apparatus according to the present invention will be detailed below. Initially, the structure will be described.

Figure 1:
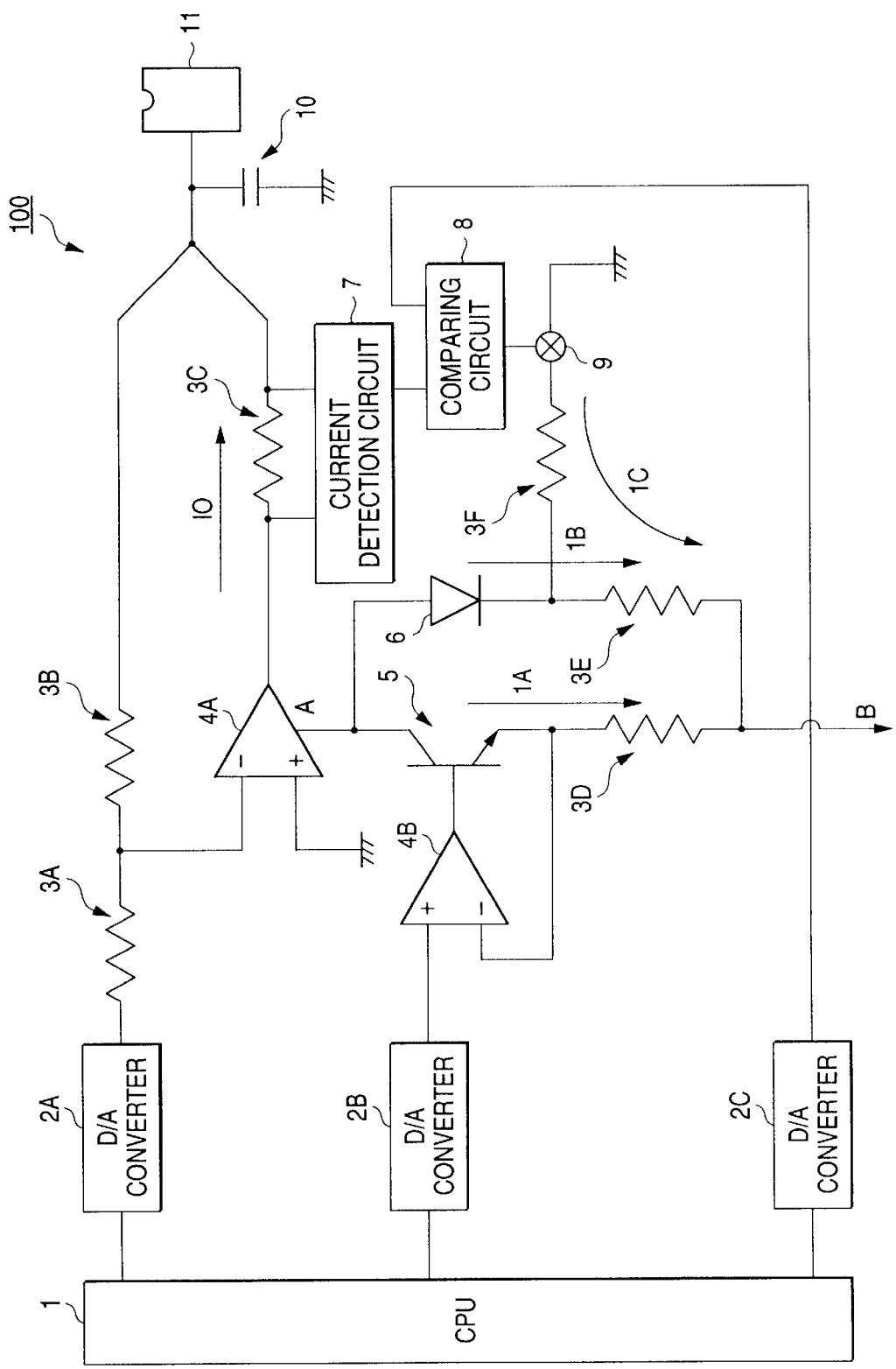
FIG. 1 is a view showing the circuit structure of a current limiting apparatus 100 in an embodiment to which the present invention is applied.
Figure 5:
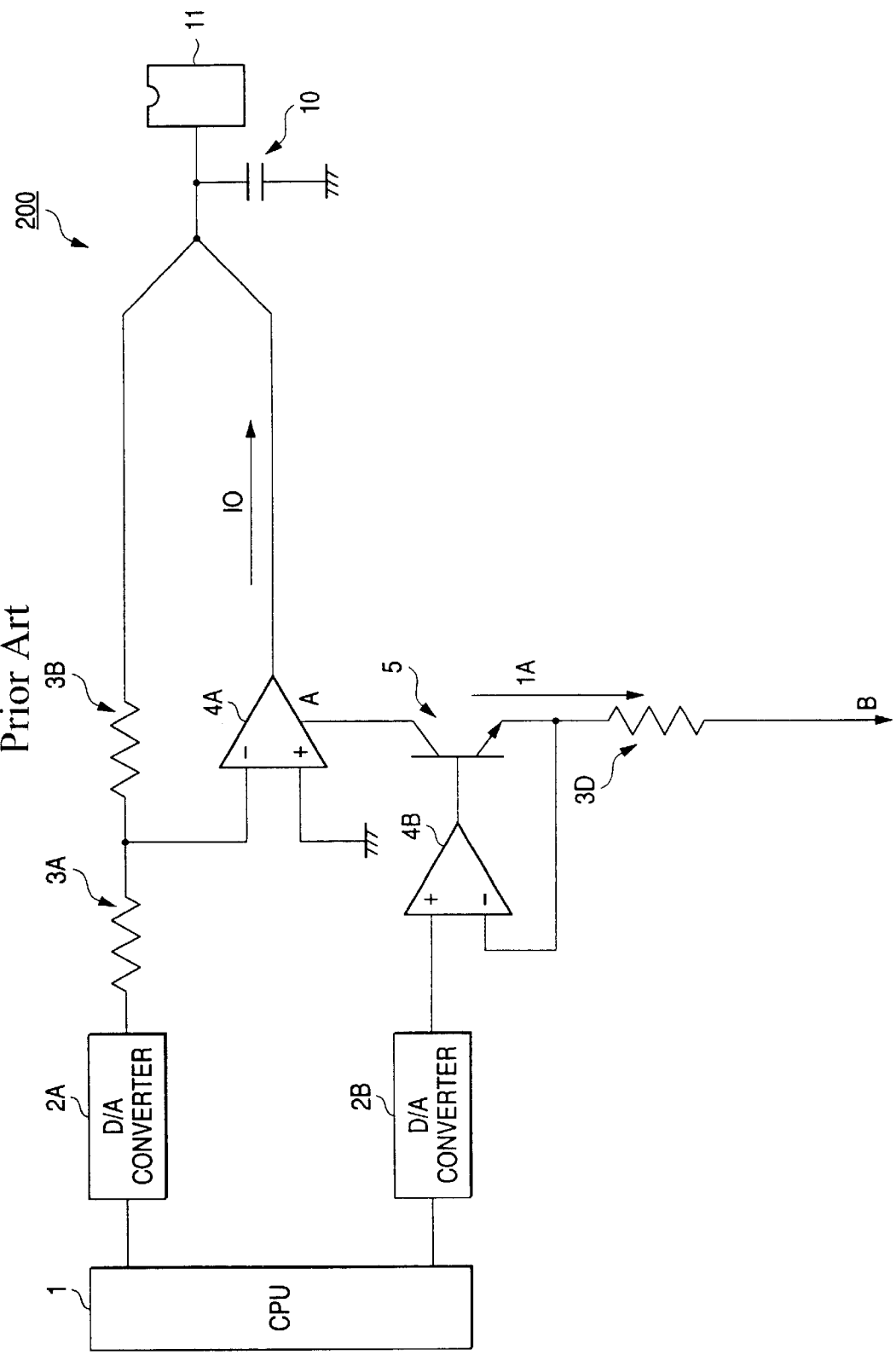
FIG. 5 is a view showing the circuit structure of the conventional current limiting apparatus 200.
Figure 6:
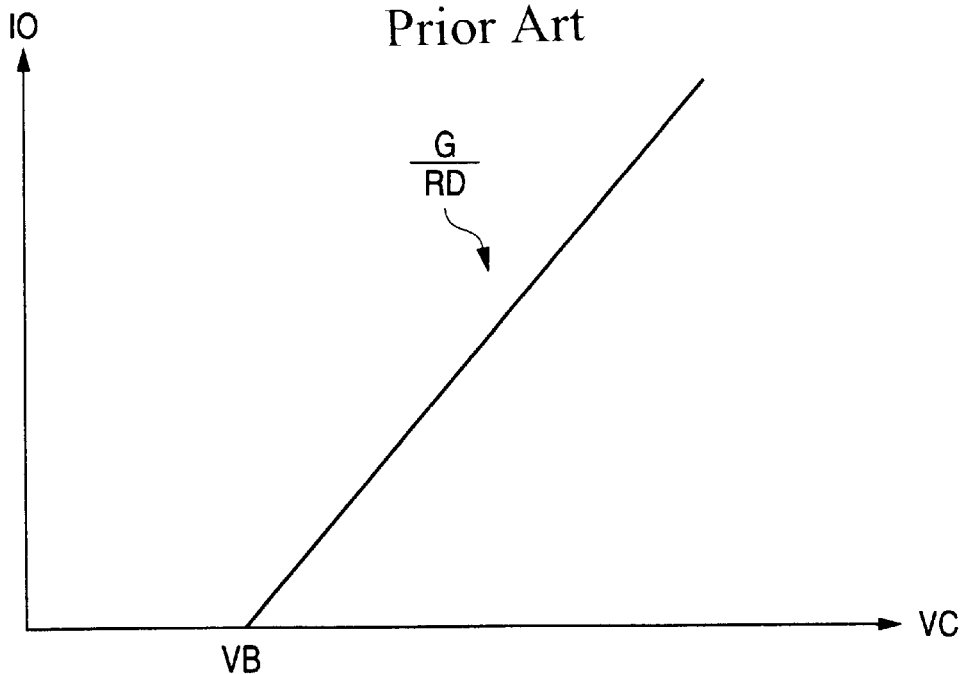
FIG. 6 is a view showing the relationship between the output current IO and the current limiting voltage VC in the conventional current limiting apparatus 200.
Figure 7:
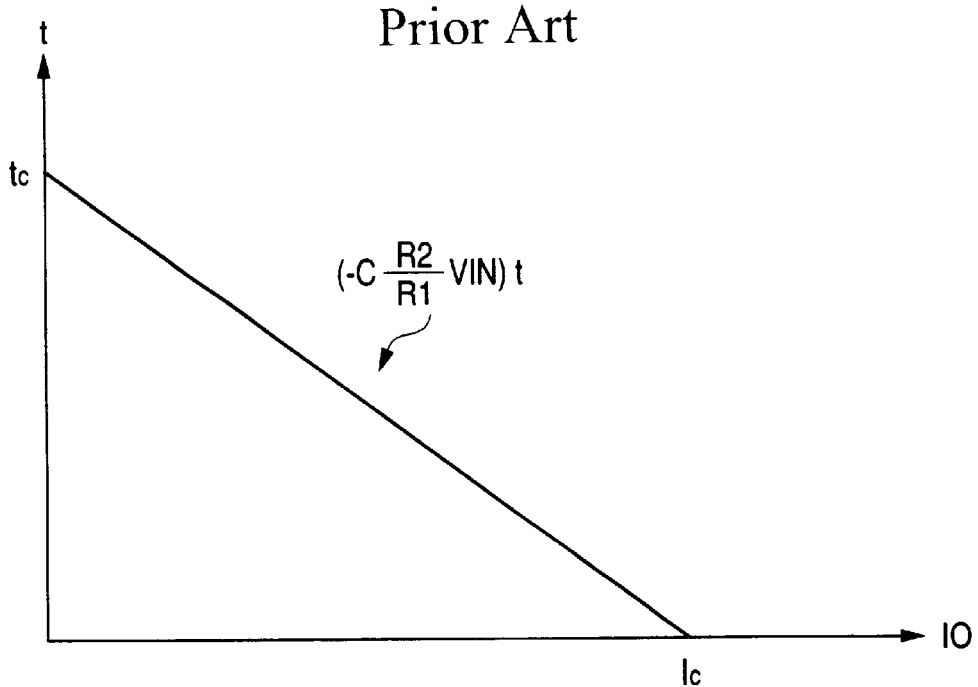
FIG. 7 is a view showing the relationship between the output current IO and the time t for charging the capacitor 10 in the conventional current limiting apparatus 200.
Figure 8:
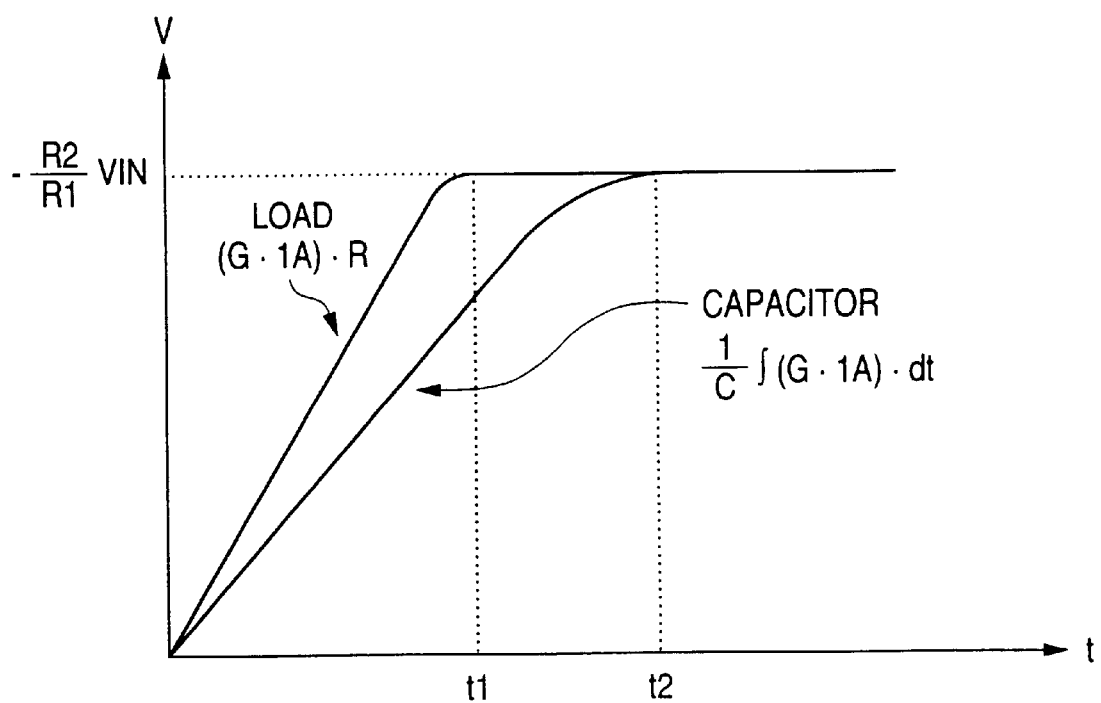
FIG. 8 is a view showing the relationship between the output voltage VO to the load 11 and the time t, and the relationship between the output voltage VO to the capacitor 10 and the time t, in the conventional current limiting apparatus 200.

Fig. 1 is a view showing the circuit structure of a current limiting apparatus 100 in an embodiment to which the present invention is applied. Incidentally, in FIG. 1, the same components as in the conventional current limiting apparatus 200 shown in FIG. 5, are denoted by the same reference numerals, and the explanation will be neglected.

In FIG. 1, the current limiting apparatus 100 is structured by a CPU 1, D/A converters 2A, 2B, and 2C, resistors 3A, 3B, 3D, 3E, and 3F, a detecting resistor 3C, operational amplifiers 4A and 4B, a transistor 5, diode 6, current detection circuit 7, comparing circuit 8, switch 9 and capacitor 10. In them, components added to the conventional current limiting apparatus 200, are the D/A converter 2C, a detecting resistor 3C, resistors 3E and 3F, a diode 6, current detection circuit 7, comparing circuit 8, and switch 9.

One end of the detecting resistor 3C is connected to the output terminal of the operational amplifier 4A, and the other end is connected to one end of the capacitor 10 and the load 11. Both ends of the detecting resistor 3C are connected to the current detection circuit 7, and further, the current detection circuit 7 is connected to one end of the input terminal of the comparing circuit 8. Further, the other end of the input terminal of the comparing circuit 8 is connected to the CPU 1 through the D/A converter 2C.

The anode of the diode 6 is connected to the current limiting adjustment terminal A of the operational amplifier 4A and the collector of the transistor 5, and the cathode of the diode 6 is connected to the resistor 3E and the resistor 3F. The other end of the resistor 3E is connected to the negative power source terminal B, and the other end of the resistor 3F is electrically grounded through the switch 9. Further, the output terminal of the comparing circuit 8 is connected to the control terminal of the switch 9.

Because the output current IO flows from the output terminal of the operational amplifier 4A to the load 11 through the detecting resistor 3C, by the voltage drop by the detecting resistor 3C, the potential difference V1–V2 is generated on both ends of the detecting resistor 3C. The potential difference signal is amplified by the current detecting circuit 7, and outputted to one end of the input terminal of the comparing circuit 8.

The CPU 1 is connected to the other input terminal of the comparing circuit 8 through the D/A converter 2C. In the comparing circuit 8, the discrimination voltage VCL is a voltage value set to compare and discriminate whether the current IO reaches the required current by the load 11. This discrimination voltage value VCL is a voltage obtained when the current slightly lower than the current satisfying the load 11 is detected by the current detection circuit 7, and previously stored in the CPU 1. Then, the comparing circuit 8 finds the detection voltage VRC which is the potential difference of both ends of the resistor 3C, from the current value detected by the current detection circuit 7, and compares and discriminates it to the discrimination voltage VCL which is set and inputted from the CPU 1 through the D/A converter 2C.

The switch 9 is turned OFF by the comparing circuit 8 when the detection voltage VRC is smaller than the discrimination voltage VCL, and the other end of the resistor 3F is in the opened condition, and reversely, the switch 9 is turned ON when the detection voltage VRC is larger than the discrimination voltage VCL, and the other end of the resistor 3F is in the electrically grounded condition.

Herein, when the switch 9 is turned OFF, the diode 6 is biased in the forward direction and turned ON, and the current IB flows from the current limiting adjustment terminal A of the operational amplifier 4A to the negative power source terminal B through the diode 6, and the resistor 3E. Further, when the switch 9 is turned ON, because the other end of the resistor 3F is electrically grounded, by the voltage dividing by the resistance ratio of the resistor 3E and the resistor 3F, when the voltage of the cathode of the diode 6 is higher than the voltage of the current limiting adjustment terminal A, and lower than the ground voltage (0 V), the diode 6 is under the reverse bias condition, and is turned OFF, and the current IC flows from the grounded point to the negative source terminal B through the switch 9, resistor 3F, and resistor 3E.

Figure 2:
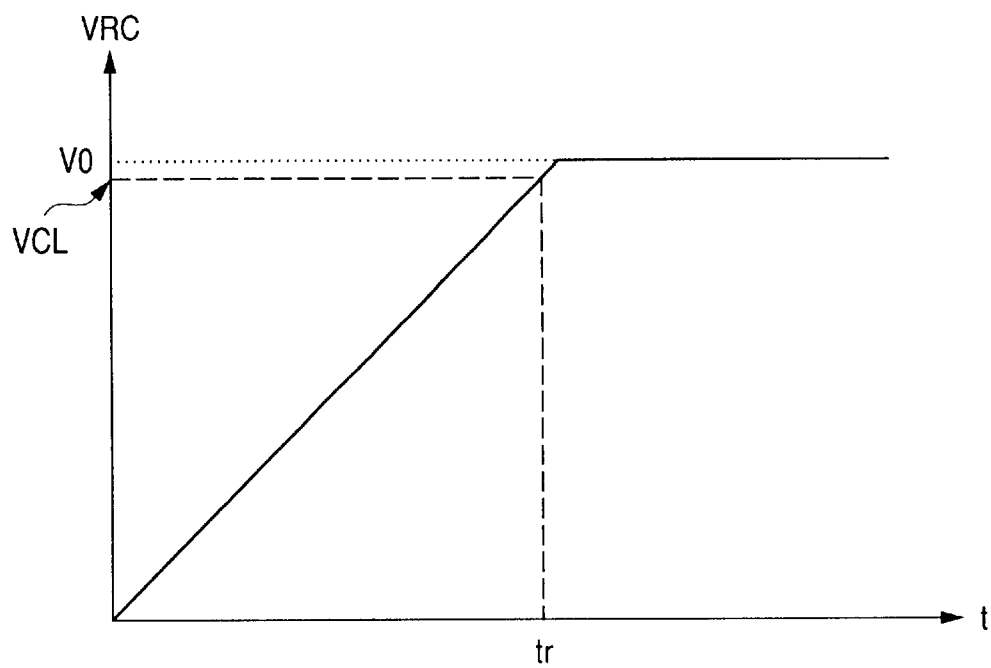
FIG. 2 is a view showing the relationship between the detection voltage VRC of the current limiting apparatus 100 and the time t until the current reaches the required current by a load 11, in an embodiment to which the present invention is applied.
Figure 3:
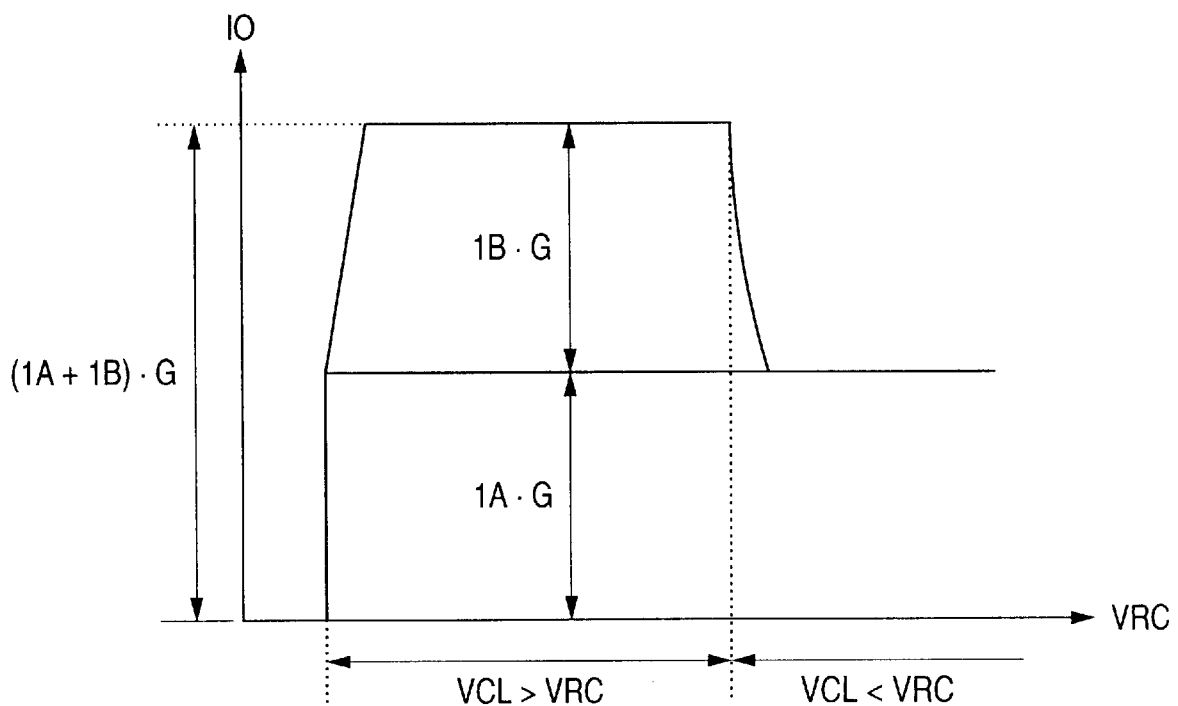
FIG. 3 is a view showing the relationship between the output current IO and the detection voltage VRC, when the detection voltage VRC and the discrimination voltage VCL are compared by the comparing circuit 8 to each other, in the present embodiment.

FIG. 2 is a view showing the relationship between the time t to which the current reaches the current value required by the load 11, and the detection voltage VRC. In FIG. 2, until the detection voltage VRC reaches the discrimination voltage VCL, time tr is required. FIG. 3 is a view showing the relationship between the output current IO when the detection voltage VRC and the discrimination voltage VCL are compared and discriminated by the comparing circuit 8, and the detection voltage VRC.

In FIG. 3, when the detection voltage VRC is smaller than the discrimination voltage VCL, that is, in the area lower than the time tr in FIG. 2, the switch 9 is under the OFF condition, and because the current IB flows in the diode 6 in the forward bias direction, the current flowing in the current limiting adjustment terminal A is IA+IB. Therefore, the output voltage IO is, as shown in FIG. 3, (IA+IB)·G.

Further, when the detection voltage VRC is larger than the discrimination voltage VCL, that is, in the area more than the time tr in FIG. 2, the switch 9 is under the ON condition, and a current path between the negative source terminal B and the grounded point is under the continuity condition, and the current IC flows from the grounded point to the negative source terminal B by the potential difference between them. Accordingly, the output current IO is, as shown in FIG. 3, IA·G, which is the same as in the conventional current limiting apparatus 200.

Herein, when the negative source voltage is VB, and the resistance values of the resistors 3E and 3F are respectively RE and RF, then, the current IC is $$IC = -VB/(RE+RF) \quad (7).$$

In this case, because the diode 6 is under the reversal bias condition, the current flowing to the negative source terminal B is IA+IC. However, the limiting current flowing to the current limiting adjustment terminal A is only IA, as shown in FIG. 3, and because the limiting current IA which is initially set by the CPU 1 becomes effective, thereby, the output current IO is limited so that it does not flow excessively.

Next, operations will be described. In order to limit the output current IO flowing to the load 11, the CPU 1 outputs the voltage signal to limit the output current IO as the digital signal to the D/A converter 2B. The D/A converter 2B converts the inputted digital voltage signal into the analog digital signal VC, and applies the voltage VC onto the non-reversal input terminal of the operational amplifier 4B. By the output of the operational amplifier 4B, the base voltage of the transistor 5 is controlled, and the limiting current IA flowing into the current limiting adjustment terminal A is set. According to this, the current limitation is conducted so that the output current IO of the operational amplifier 4A is not excessively increased.

Further, in order to set the discrimination voltage VCL, the CPU 1 outputs the voltage signal as the digital signal to the D/A converter 2C. The D/A converter 2C converts the inputted digital signal into the analog voltage value VCL, and outputs it to the other end of the input terminal of the comparing circuit.

Further, in order to set the input voltage VIN, the CPU 1 outputs the voltage signal as the digital signal to the D/A converter 2A. The D/A converter 2A converts the inputted digital signal into the analog voltage value VIN, and applies it onto the load 11 through the resistors 3A and 3B. When this voltage VIN is applied onto the reversal input terminal of the operational amplifier 4A, the operational amplifier 4A outputs the current to the output terminal in order to supply the current required by the load 11.

Because the output current IO of the operational amplifier 4A flows through the detecting resistor 3C to the load 11, the potential difference of V1−V2 corresponding to the voltage drop due to the detecting resistor 3C is generated on both ends of the detecting resistor 3C. The current detection circuit 7 detects this potential difference, and amplifies the potential difference signal, and outputs the detection voltage VRC obtained thereby to the comparing circuit 8.

The comparing circuit 8 compares the detection voltage VRC to the discrimination voltage VCL, and by the comparison result, controls the switch 9.

While the detection voltage VRC is smaller than the discrimination voltage VCL, because the switch 9 continues OFF condition, the diode 6 is biased in the forward direction, and the current flows from the current liming adjustment terminal A to the negative source terminal B through the diode 6, and the resistor 3E. Thereby, the current flowing into the current liming adjustment terminal A is IA+IB, and the output current IO can flow the larger current than the limiting current IA set by the CPU 1. In this case, because the base voltage of the transistor 5 is controlled by the constant output voltage of the operational amplifier 4B, the limiting current IA becomes the constant current, and the output current IO of the operational amplifier 4A can be determined by the current IB flowing through the resistor 3E.

Then, because the current value IB is the function depending only on the resistor 3E, when the resistance value of the resistor 3E is determined so that the output current provided in the operational amplifier 4A can be made maximum, the current required by the load 11 and the capacitor 10 can be supplied, and further, because the current can be supplied by the capacity to drive the maximum current provided in the operational amplifier 4A, the time necessary for charging the capacitor 10 is reduced, and the setting voltage can be quickly applied onto the load 11.

Further, at the time point at which the detection voltage VRC is larger than the discrimination voltage VCL, the comparing circuit 8 tuns ON the switch 9, and because the diode 6 is reversely biased, the current IB does not flow. Thereby, the current flowing from the current liming adjustment terminal A to the negative source terminal B is only the limiting current IA, and the operational amplifier 4A operates so as to limit the output current IO.

Figure 4:
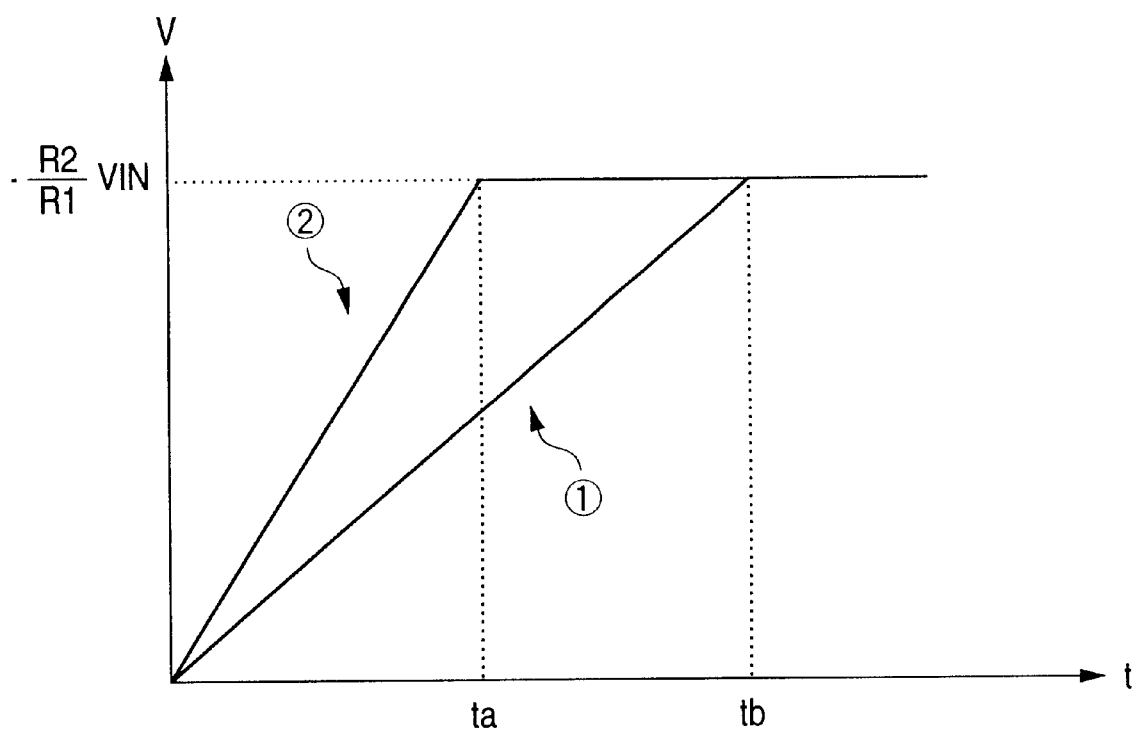
FIG. 4 is a view showing the relationship between the time t for supplying the required current by the load 11 and the voltage V to be supplied onto the load 11, when the conventional current limiting apparatus 200 and the current limiting apparatus 100 of the present invention are compared to each other.

FIG. 4 is a view showing the relationship between the time t to supply the current required by the load 11 and the voltage V to be applied onto the load 11, when the conventional current limiting apparatus 200 and the current limiting apparatus 100 of the present invention are compared to each other. In the conventional current limiting apparatus 200, because the output current IO to be supplied to the load 11 is limited by the limiting current IA, the output current IO is IO=IA·G, and the supply time tb is necessary (refer to (1) in FIG. 4).

However, in the current limiting apparatus 100 of the present invention 100, until the detection voltage VRC reaches the discrimination voltage VCL, the limiting current flowing into the current limiting adjustment terminal A is the current of the addition of the current limiting current IA and the current IB. In this case, because the output current IO is (IA+IB)·G, the supply time is ta (refer to (2) in FIG. 4), and the supply time to the load 11 by the current limiting apparatus 100 of the present invention is more quickened than that in the conventional current limiting apparatus 200 by (tb−ta).

As described above, in the current limiting apparatus 100 of the present embodiment, by adding the D/A converter 2C, detecting resistor 3C, resistors 3E and 3F, diode 6, current detection circuit 7, comparing circuit 8, and switch 9 to the conventional current limiting apparatus 200, the value of the current flowing from the current limiting adjustment terminal A of the operational amplifier 4A is controlled. Therefore, until the detection voltage VRC, which is the potential difference between both ends of the resistor 3C, is larger than the discrimination voltage VCL, which is set by the CPU 1, the output current IO is the larger current than the setting value, and when the detection voltage VRC is larger than the discrimination voltage VCL, the output current IO returns to the original setting value set by the CPU 1.

Accordingly, according to the current limiting apparatus 100 of the present embodiment, by quickly charging the capacitor 10, because the setting voltage can be quickly applied onto the load 11, the test time of the load 11 can be reduced, and when the voltage applied onto the load 11 reaches the setting voltage, the output current IO inputted into the load 11 can be limited to a predetermined value.

According to the current limiting apparatus of the present invention, the power source voltage can be quickly applied onto the sample to be measured, and as the overall test, the test time of the sample to be measured can be shortened.

What is claimed is:

1. A current limiting apparatus comprising:
    a power source signal output means for outputting a voltage signal to supply a power source to a sample to be measured;
    a signal amplifying means for amplifying the voltage signal outputted by the power source signal output means;
    a power source fluctuation absorption means for absorbing the fluctuation of the power source supplied to the sample to be measured by the voltage signal amplified by the signal amplifying means;
    an amplification factor setting means for setting a amplification factor in the signal amplifying means;
    a current detection means for detecting a current value to be inputted into the sample to be measured;
    a voltage calculation means for calculating the voltage at the current detection position, according to the current value detected by said current detection means;
    a voltage setting means for setting the predetermined voltage;
    a voltage comparing means for comparing the voltage value set by said voltage setting means to the voltage value calculated by said voltage calculation means; and
    an amplification factor changing means for changing the setting of the amplification factor of the amplification factor setting means, according to the comparison result of said voltage comparing means.

2. The current limiting apparatus according to claim 1, wherein,
    when said voltage comparing means detects that the voltage value calculated by said voltage calculation means is larger than the predetermined voltage value set by said voltage setting means, said amplification factor changing means reduces the setting of the amplification factor of said amplification factor setting means.

3. The current limiting apparatus according to claim 1 or claim 2, wherein said amplification factor changing means includes a diode and a switch, and
by ON/OFF-controlling said switch, the setting of the amplification factor of said amplification factor setting means is changed.

4. The current limiting apparatus according to claim 3, wherein
    said power source signal output means includes a D/A converter to convert a digital signal into an analog voltage signal,
    said signal amplifying means is a reversal amplification circuit connected to the output of the D/A converter,
    said power source fluctuation absorption means is a capacitor which is connected to the sample to be measured and absorbs the power source fluctuation of the sample to be measured,
    said amplification factor setting means is structured by the D/A converter which converts the arbitrarily set output current limitation information into a voltage value and outputs, and the second operational amplifier, which is connected to the output of the D/A converter, to control the base voltage of a transistor to flow the constant current, which is connected to a current limiting adjustment terminal of the first operational amplifier structuring the reversal amplifier circuit, and
    said amplification factor changing means is structured by the diode which is connected in parallel to a current path between emitter and collector of the transistor, and an anode is connected to a current limiting adjustment terminal of the first operational amplifier and a cathode is connected to a negative source voltage terminal through a resistor, and the switch which is connected to the cathode of the diode, and the other end is electrically grounded, and wherein
    said current detection means detects the current flowing into the detecting resistor.

5. The current limiting circuit according to claim 4, wherein,
    while the current flowing into the detecting resistor reaches a predetermined current value, the switch is turned OFF by said voltage comparing means, and when the current is flown to the negative source voltage terminal from the current limiting adjustment terminal of the first operational amplifier through the diode and the resistor, and the previously set current flowing from the current limiting adjustment terminal of the first operational amplifier is increased, the input current flowing into the sample to be measure is increased, and
    when the current flowing into the detecting resistor reaches a predetermined current value, the switch is turned ON by said voltage comparing means, and the reversal voltage is applied onto the diode, and the current flowing from the current limiting adjustment terminal of the first operational amplifier is returned to a previously set value, and only while the capacitor is charged, the maximum value of the output current of the first operational amplifier is increased, and the source voltage applied onto the sample to be measured is quickly raised up.

* * * * *